United States Patent
Mun et al.

(10) Patent No.: US 9,824,777 B2
(45) Date of Patent: Nov. 21, 2017

(54) STORAGE SYSTEM MANAGING RUN-TIME BAD CELLS

(71) Applicant: SAMSUNG ELECTRONICS CO., LTD., Suwon-si (KR)

(72) Inventors: Kui-Yon Mun, Hwaseong-si (KR); Jaegeun Park, Suwon-si (KR); Youngkwang Yoo, Yongin-si (KR); Biwoong Chung, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/796,533

(22) Filed: Jul. 10, 2015

(65) Prior Publication Data
US 2016/0012918 A1 Jan. 14, 2016

(30) Foreign Application Priority Data

Jul. 10, 2014 (KR) ........................ 10-2014-0087001

(51) Int. Cl.
*G11C 29/42* (2006.01)
*G11C 29/44* (2006.01)
*G11C 29/00* (2006.01)
G11C 29/54 (2006.01)

(52) U.S. Cl.
CPC .............. *G11C 29/42* (2013.01); *G11C 29/44* (2013.01); *G11C 29/789* (2013.01); *G11C 2029/4402* (2013.01)

(58) Field of Classification Search
CPC ......... G11C 29/42; G11C 29/44; G11C 29/56; G11C 29/48; G11C 29/40; G11C 29/789; G11C 2029/4402
See application file for complete search history.

(56) References Cited

U.S. PATENT DOCUMENTS

| | | | |
|---|---|---|---|
| 6,684,353 B1* | 1/2004 | Parker | G11C 29/44 |
| | | | 714/718 |
| 7,143,236 B2 | 11/2006 | Pomaranski et al. | |
| 7,642,105 B2 | 1/2010 | Co et al. | |
| 7,791,966 B2 | 9/2010 | Imai | |
| 8,208,325 B2 | 6/2012 | Urakawa et al. | |
| 2004/0010612 A1* | 1/2004 | Pandya | H04L 29/06 |
| | | | 709/230 |
| 2004/0088614 A1 | 5/2004 | Wu | |
| 2004/0181656 A1* | 9/2004 | Stern | G06F 9/4403 |
| | | | 713/1 |

(Continued)

FOREIGN PATENT DOCUMENTS

| | | |
|---|---|---|
| JP | 2003-16798 A | 1/2003 |
| JP | 2004-55041 A | 2/2004 |

(Continued)

*Primary Examiner* — Cynthia Britt
*Assistant Examiner* — Dipakkumar Gandhi
(74) *Attorney, Agent, or Firm* — Sughrue Mion, PLLC

(57) ABSTRACT

A storage system is provided which includes: a storage device including a first memory, which may be nonvolatile memory, and a second memory, which may be a device memory, and configured to request a test on at least one of the first and second memories; and a host configured to test the at least one memory in response to the request for the memory test from the storage device and store the test result in the first memory or a third memory.

20 Claims, 19 Drawing Sheets

(56) References Cited

U.S. PATENT DOCUMENTS

| | | | |
|---|---|---|---|
| 2005/0028038 A1* | 2/2005 | Pomaranski | G06F 11/2268 |
| | | | 714/42 |
| 2007/0226403 A1* | 9/2007 | Son | G06F 1/3221 |
| | | | 711/103 |
| 2010/0246298 A1* | 9/2010 | Zhang | G11C 5/147 |
| | | | 365/200 |
| 2010/0318879 A1* | 12/2010 | Yu | G06F 11/1004 |
| | | | 714/758 |
| 2013/0036254 A1* | 2/2013 | Fai | G06F 11/263 |
| | | | 711/103 |
| 2013/0227342 A1* | 8/2013 | Shepherd | G11C 29/44 |
| | | | 714/6.13 |

FOREIGN PATENT DOCUMENTS

| | | |
|---|---|---|
| JP | 2006-309909 A | 11/2006 |
| JP | 2008-107897 A | 5/2008 |

* cited by examiner

US 9,824,777 B2

STORAGE SYSTEM MANAGING RUN-TIME BAD CELLS

CROSS-REFERENCE TO THE RELATED APPLICATION

This application claims priority from Korean Patent Application No. 10-2014-0087001 filed Jul. 10, 2014, in the Korean Intellectual Property Office, the disclosure of which is incorporated herein in its entirely by reference.

BACKGROUND

The exemplary embodiments of the inventive concept described herein relate to a storage system, and more particularly, relate to a storage system capable of managing run-time bad cells.

A storage system includes a host and a storage device. The host and the storage device are connected through a variety of standardized interfaces, such as a serial AT Attachment (SATA), universal flash storage (UFS), a small computer small interface (SCSI), a serial attached SCSI (SAS), and an embedded multi-media controller (eMMC).

A storage device contains a nonvolatile memory and a device memory. The nonvolatile memory may include the following: flash memory, electrically erasable programmable read-only memory (EEPROM), magnetoresistive random-access memory (MRAM), phase-change memory (PRAM), and ferroelectric random-access memory (FeRAM). The device memory is used to temporarily store data to be written at the nonvolatile memory or data read out from the nonvolatile memory. The device memory may be implemented with a volatile memory or a nonvolatile memory. The device memory may include the following: dynamic random-access memory (DRAM), static random-access memory (SRAM), MRAM, PRAM, and FeRAM.

The nonvolatile memory or the device memory includes a plurality of memory cells. In the nonvolatile memory or the device memory, a defect may happen at memory cells when fabricated or used. Below, the defective memory cell is referred to as a bad cell. Bad cells that occur when fabricated are easily searched by testing the whole memory area. However, it is difficult to search bad cells that occur when a product including the memory cells is used.

SUMMARY

According to an exemplary embodiment of the inventive concept, there is provided a storage system which may include: a storage device including a first memory and a second memory, and configured to request a memory test on at least one of the first and second memories; and a host configured to test the at least one of the first and second memories in response to the request for the memory test from the storage device, and store the test result in the first memory or a third memory. Here, the first memory may be a nonvolatile memory, and the second memory may be a device memory.

The storage device may further include a cell monitor, and the storage device may detect a state of the at least one memory by means of the cell monitor. The storage device may request the memory test to the host at a predetermined time interval or in response to determining that the detected state of the at least one memory corresponds to a predetermined condition.

The predetermined condition may be at least one of: that an error in an error correction code (ECC) of the at least one memory is over an amount of a reference error; that a leakage current of the at least one memory increases over an amount of a reference current; that a temperature of the at least one memory is higher than a reference temperature; that utilization of the at least one memory is over a predetermined level during a reference time; and that a number of read, write or erase operations performed by the at least one memory exceeds a predetermined level.

The host may test the at least one memory in response to the request for the memory test from the storage device to find run-time bad cells.

The host may generate a bad cell list depending on the run-time bad cells, and store the bad cell list in the first or third memory or update a bad cell list stored in the first or third memory.

According to another exemplary embodiment, there is provided a storage device which may include: a first memory and a second memory at least one of which is subject to a memory test by an external device; and a memory controller to request the external device to perform the memory test, wherein a result of the memory test is stored in the first memory or a third memory connected to the storage device.

Here, the storing the result of the memory test in the first memory or the third memory may be performed by storing a list of bad cells of the at least one memory in the first or third memory, or updating a list of bad cells of the at least one memory previously stored in the first or third memory.

The bad cells may be run-time bad cells which have occurred when a product including the storage device is in use.

The memory controller may generate the memory test request at a predetermined time interval or in response to determining that a predetermined condition of the at least one memory is satisfied, wherein the predetermined condition is one of the above-listed conditions.

Here, the first memory or the third memory may be a flash memory, an EEPROM, an MRAM, a PRAM, or an FeRAM, and the second memory may be a DRAM, a SRAM, an MRAM, a PRAM, or an FeRAM.

The memory controller may request the external device to perform the memory test in response to determining at least one of: that a power state of the storage device is changed from an off-state to an on-state; that the at least one memory is in an idle time; and that a number of read, write or erase operations currently being executed or to be executed in the at least one memory within a predetermined time is less than a predetermined number.

The memory controller may request the external device to perform the memory test subject to at least one of conditions including: that an error in an error correction code (ECC) of the at least one memory is over an amount of a reference error; that a leakage current of the at least one memory increases over an amount of a reference current; that a temperature of the at least one memory is higher than a reference temperature; that utilization of the at least one memory is over a predetermined level during a reference time; and that a number of read, write or erase operations of the at least one memory exceeds a predetermined level.

According to still another exemplary embodiment, there is provided a method of performing a memory test at a storage device. The method may include: generating a request for a memory test by an external device with respect to at least one of a first memory and a second memory included in the storage device; transmitting the request for the memory test to the external device; and receiving and storing a result of the memory test performed by the external device in the first memory or a third memory.

With the above embodiments, a test operation is conducted when a storage system is testable in response to a memory test request of a storage device. Thus, it is possible to find bad cells, occurring at a product in use, in real time without affecting performance of the storage system.

BRIEF DESCRIPTION OF THE DRAWINGS

The above and other aspects will become apparent from the following description with reference to the following drawings, in which.

DETAILED DESCRIPTION

Figure 1:
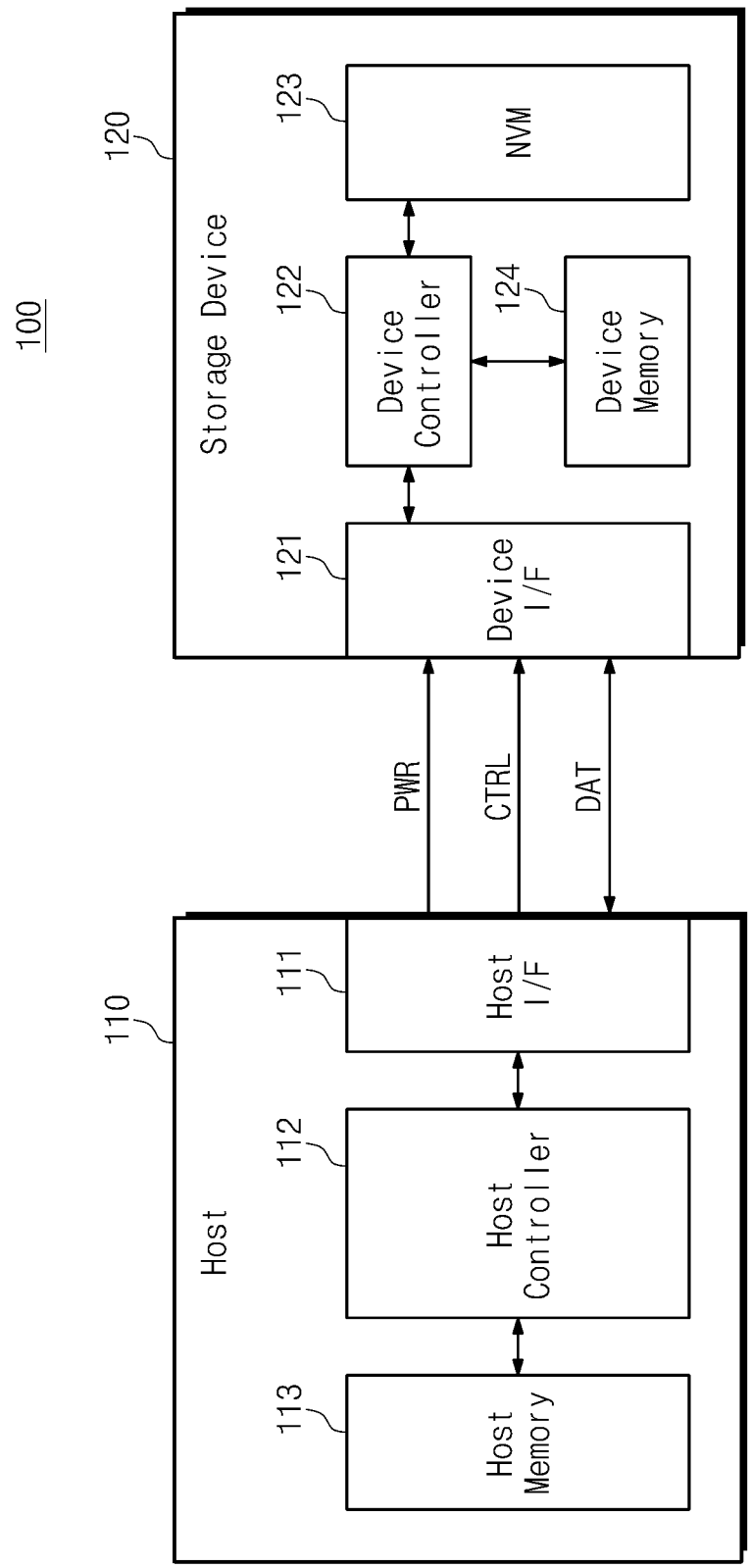
FIG. 1 is a block diagram schematically illustrating a storage system, according to an exemplary embodiment.

Exemplary embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a storage system, according to an exemplary embodiment. Referring to FIG. 1, a storage system 100 includes a host 110 and a storage device 120. The host 110 and the storage device 120 may be connected through a variety of standardized interfaces including the following: a serial ATA (SATA), universal flash storage (UFS), a small computer small interface (SCSI), a serial attached SCSI (SAS), and an embedded multi-media controller (eMMC).

As illustrated in FIG. 1, a host interface 111 and a device interface 121 are connected through data lines DAT for exchanging data or signals, a power line PWR for providing a power, and a control line CTRL for transferring control signals. The host 110 includes a host controller 112 and a host memory 113.

The host controller 112 controls operations that the host 110 executes. The host controller 112 controls application programs that an application processor executes, or manages files or data of the storage device 120 by means of a file system. The host controller 112 drives peripheral devices that are connected to the host 110 through a device driver. The host controller 112 receives or provides data from or to the storage device 120 through the host interface 111.

The host memory 113 is used as a main memory or a cache memory of the host 110. The host memory 113 is also used as a driving memory for driving software including the following: application, file system, and device driver.

The storage device 120 is connected to the host 110 through the device interface 121. The storage device 120 includes a device controller 122, a nonvolatile memory 123, and a device memory 124. The device controller 122 controls an overall operation of the nonvolatile memory 1210 including a write operation, a read operation, an erase operation, and so on. The device controller 122 exchanges data and an address with the nonvolatile memory 123 or the device memory 124 through a data bus.

The nonvolatile memory 123 may include the following: flash memory, MRAM, PRAM, and FeRAM. The device memory 124 is used to temporarily store data to be written at the nonvolatile memory 123 or data read out from the nonvolatile memory 123. The device memory 124 is implemented with a volatile memory or a nonvolatile memory. The device memory 124 may include the following: DRAM, SRAM, MRAM, PRAM, and FeRAM. The device memory 124 may be implemented with a combination of DRAM and flash memory.

The nonvolatile memory 123 and/or the device memory 124 may include a plurality of memory cells to store data.

Defective memory cells may occur at the nonvolatile memory 123 and/or the device memory 124 when manufactured or used. Below, a memory cell where a defect occurs is referred to as a bad cell. In particular, a bad cell that occurs at a fabrication level is referred to as a defective bad cell, and a bad cell that occurs when a product is in use is referred to as a run-time bad cell.

Figure 2:
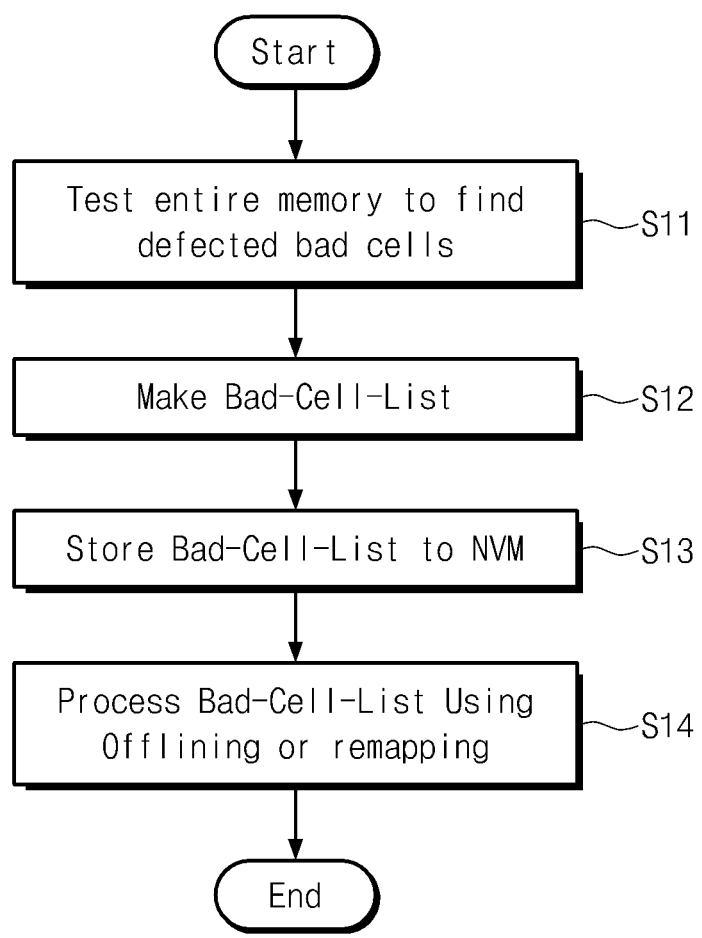
FIG. 2 is a flow chart showing a method of managing a defective bad cell occurring at a product fabrication step, according to an exemplary embodiment.
Figure 3:
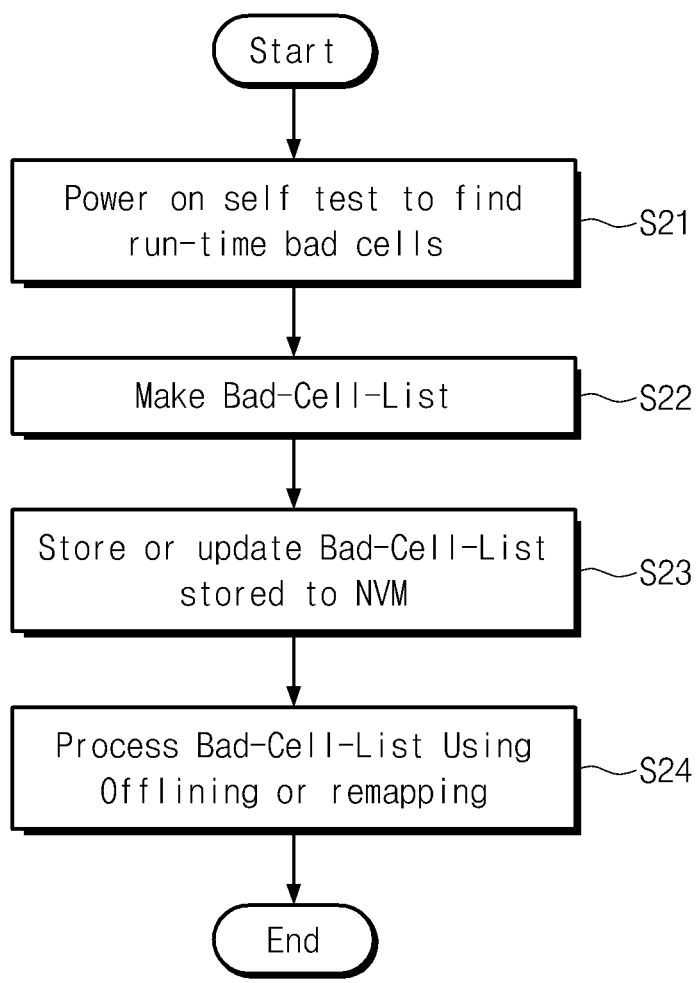
FIG. 3 is a flow chart showing a method of managing a defective bad cell occurring when a product is in use, according to an exemplary embodiment.

FIG. 2 is a flow chart showing a method of managing a defective bad cell occurring at a product fabrication step, according to an exemplary embodiment. FIG. 3 is a flow chart showing a method of managing a run-time bad cell occurring when a product is in use, according to an exemplary embodiment.

Referring to FIG. 2, in step S11, defective bad cells are found by testing the whole memory area. The whole memory area may mean a device memory 124 (refer to FIG. 1) or a nonvolatile memory 123 (refer to FIG. 1) or may include both the device memory 124 and the nonvolatile memory 123.

In step S12, a bad cell list is made depending on the defective bad cells thus found. In step S13, the bad cell list is stored at a nonvolatile memory, such as an EEPROM or a flash memory. Here, the nonvolatile memory storing the bad cell list may be the nonvolatile memory 123 or a separate memory (not shown). In step S14, the bad cell list is processed by means of an offlining or remapping method.

Referring to FIG. 3, in S21, run-time bad cells are found by conducting a power-on self-test (POST) operation with respect to a product in use. The power-on self-test operation is conducted when a storage system 100 (refer to FIG. 1) is powered on. Step S21 may be conducted at a device memory 124 (refer to FIG. 1), a nonvolatile memory 123 (refer to FIG. 1) or both the device memory 124 and the nonvolatile memory 123.

In step S22, a bad cell list is made depending on the run-time bad cells thus found. In step S23, the bad cell list is stored at a nonvolatile memory (e.g., flash memory) or a bad cell list stored in the nonvolatile memory is updated. Here, the nonvolatile memory storing the bad cell list may be the nonvolatile memory 123 or a separate memory (not shown). In step S24, the bad cell list is processed by means of an offlining or remapping method.

In FIGS. 2 and 3, an operation of finding defective bad cells at a fabrication level is conducted once; however, an operation of detecting run-time bad cells occurring at a product in use is performed whenever a power is turned on.

Figure 4:
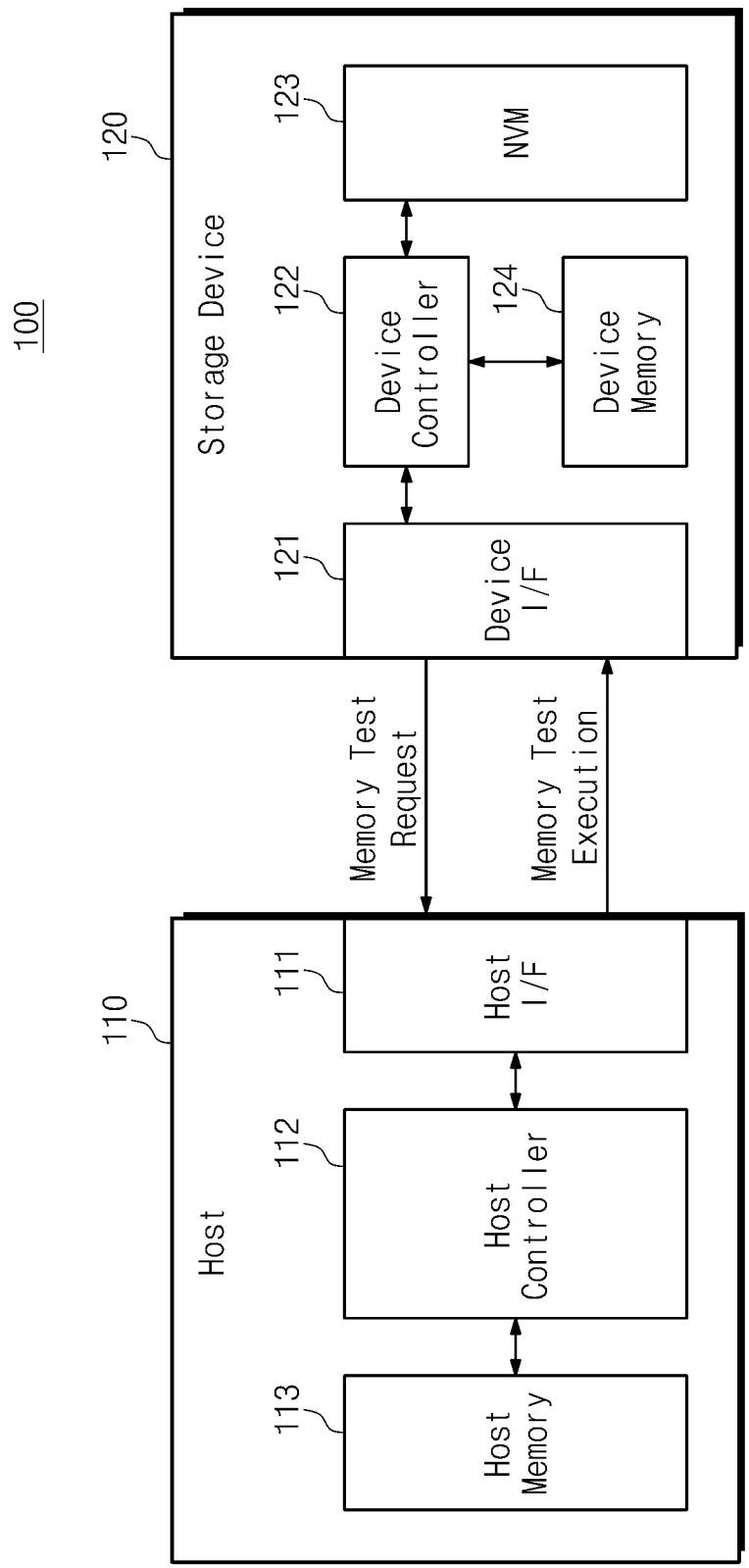
FIG. 4 is a block diagram for describing another method of processing run-time bad cells of a storage system shown in FIG. 1, according to an exemplary embodiment.

FIG. 4 is a block diagram for describing another method of processing run-time bad cells of a storage system shown in FIG. 1, according to an exemplary embodiment. Referring to FIG. 4, a storage device 120 issues a memory test request to a host 110 when there is predicted that a nonvolatile memory 123 or a device memory 124 is problematic. Receiving the memory test request, the host 110 conducts a memory test on the storage device 120.

Referring to FIG. 4, a device controller 122 detects a state of the memory 123 or 124. When a detection result satisfies a predetermined condition, the device controller 122 issues the memory test request. In an exemplary embodiment, the predetermined condition associated with the memory test request may be various.

For example, the device controller 122 may issue the memory test request when an error correction code (ECC) error of the memory 123 or 124 is over a predetermined level, a leakage current of the memory 123 or 124 increases, or the memory 123 or 124 is unstable. The device controller 122 also may make the memory test request periodically or when at least one of these memories has been used over a predetermined time.

Figure 5:
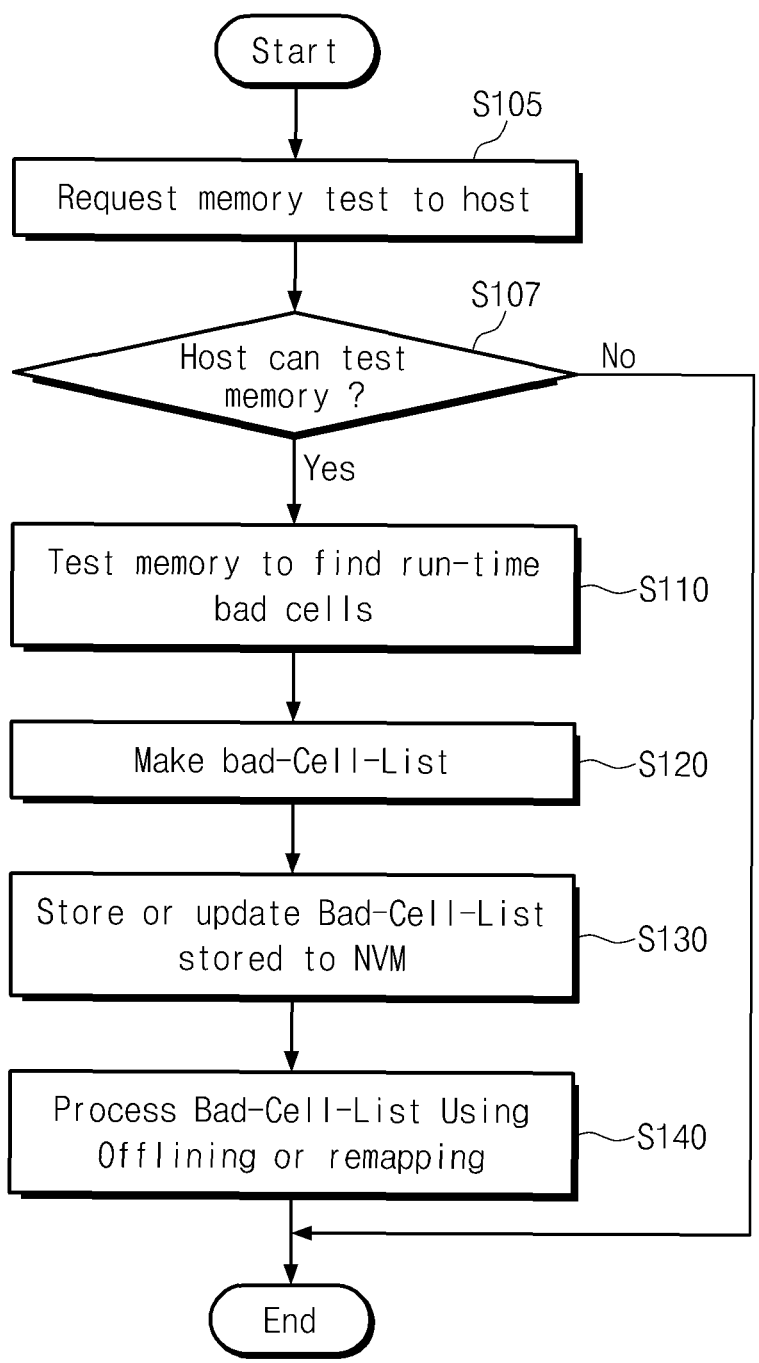
FIG. 5 is a flow chart showing a method of processing run-time bad cells of a storage system shown in FIG. 4, according to an exemplary embodiment.

FIG. 5 is a flow chart showing a method of processing run-time bad cells of a storage system shown in FIG. 4, according to an exemplary embodiment.

Referring to FIG. 5, in step S105, a storage device 120 requests a memory test to a host 110 when there is predicted at product utilization level that the memory 123 or 124 (refer to FIG. 4) of the storage device 120 is problematic. In step S107, the host 110 determines whether to test the memory. As a consequence of determining that the host cannot test the memory, the memory test is ignored. Afterwards, the method ends. As a consequence of determining that the host can test the memory, the method proceeds to step S110.

In step S110, the host 110 conducts the memory test to find run-time bad cells. In step S120, a bad cell list is made depending on run-time bad cells thus found. In step S130, the bad cell list is stored in a nonvolatile memory 123 or a bad cell list previously stored in the nonvolatile memory is updated. Here, the nonvolatile memory storing the bad cell list may be the memory 123 or a separate memory (not shown). In step S140, the bad cell list is processed by means of an offlining or remapping method.

In a method described with reference to FIG. 3, an operation of detecting run-time bad cells is conducted whenever the storage system 100 is powered on. In a method described with reference to FIG. 5, an operation of detecting run-time bad cells is conducted in real time when there is predicted that the storage device 120 is problematic.

Figure 6:
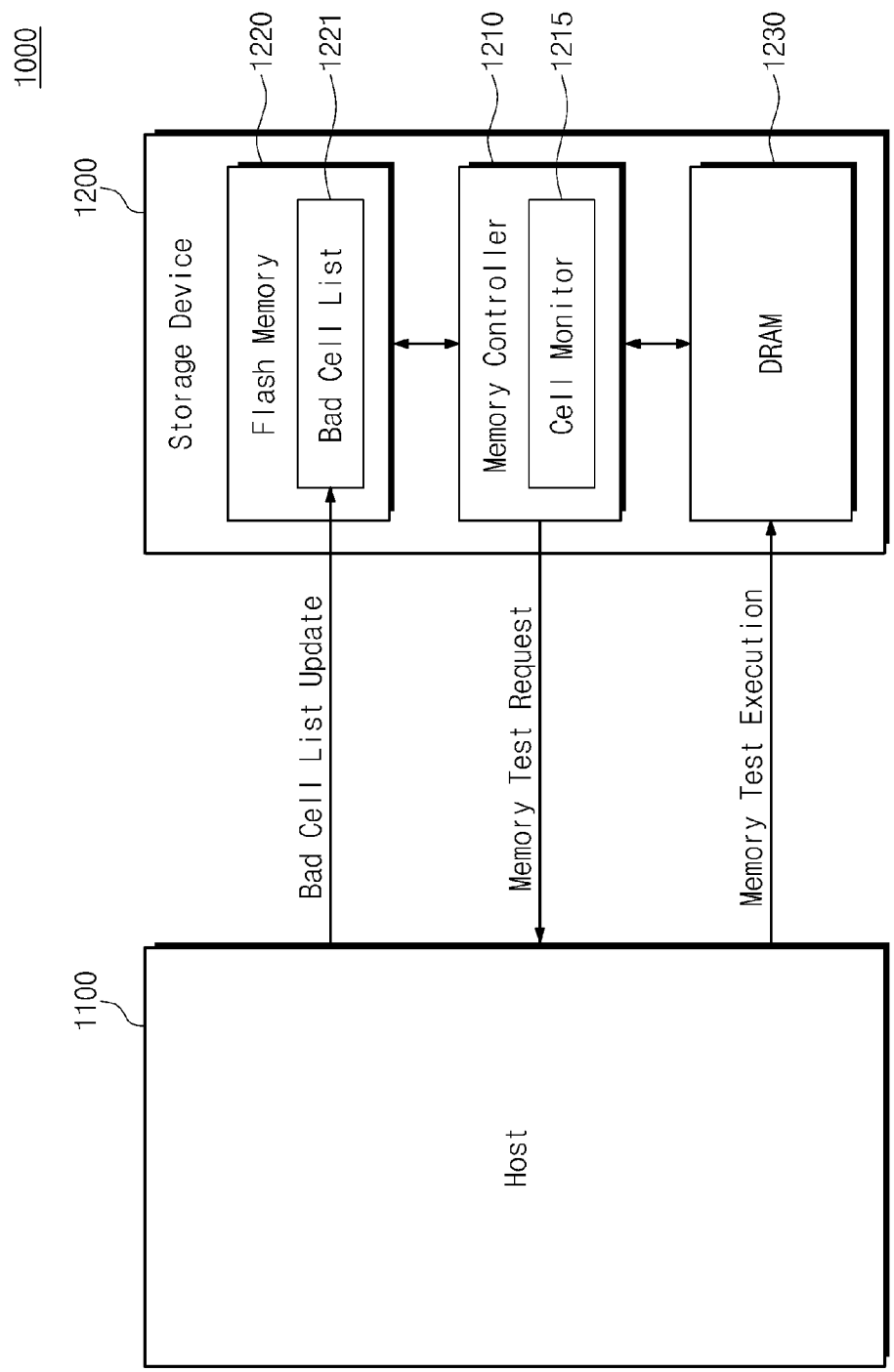
FIG. 6 is a block diagram schematically illustrating a method of processing run-time bad cells of a storage system, according to an exemplary embodiment.

FIG. 6 is a block diagram schematically illustrating a method of processing run-time bad cells of a storage system, according to an exemplary embodiment. Referring to FIG. 6, a storage system 1000 includes a host 1100 and a storage device 1200. The storage device 1200 includes a memory controller 1210, a flash memory 1220, and a DRAM 1230.

The memory controller 1210 includes a cell monitor 1215. The cell monitor 1215 predicts or detects a problem with the DRAM 1230. The memory controller 1210 predicts a problem with the DRAM 1230 by means of the cell monitor 1215, and requests a memory test to the host 1100. The host 1100 tests the DRAM 1230 in response to the memory test request. The memory controller 1210 sends a test result of the DRAM 1230 to the host 1100, and the host 1100 stores a bad cell list 1221 in the flash memory 1220 or update a previously stored bad cell list in the flash memory 1220.

Figure 7:
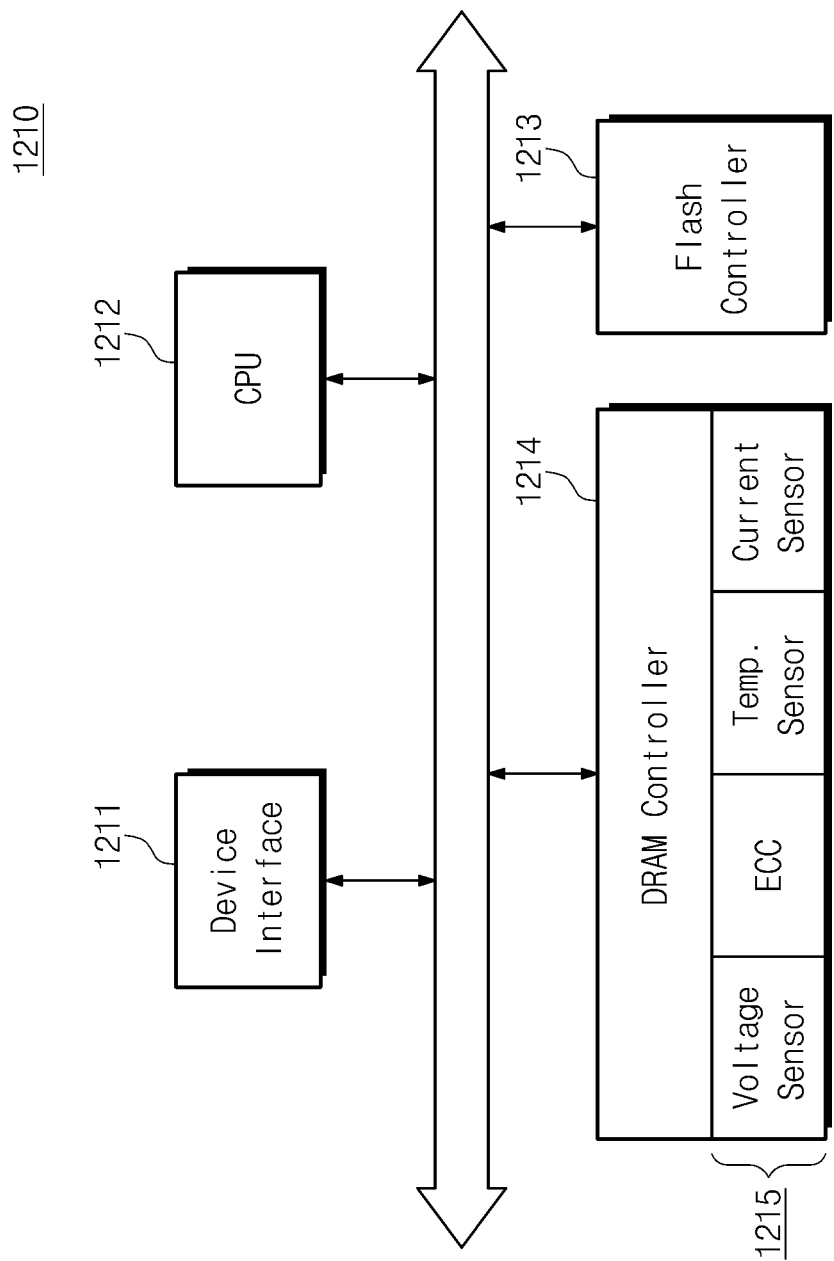
FIG. 7 is a block diagram schematically illustrating a memory controller shown in FIG. 6, according to an exemplary embodiment.

FIG. 7 is a block diagram schematically illustrating a memory controller shown in FIG. 6, according to an exemplary embodiment. Referring to FIG. 7, a memory controller 1210 includes a device interface 1211, a central processing unit (CPU) 1212, a flash controller 1213, a DRAM controller 1214, and a cell monitor 1215. In an exemplary embodiment, the cell monitor 1215 may be placed inside or outside the DRAM controller 1214.

The cell monitor 1215 detects a state of the DRAM 1230. The cell monitor 1215 generates a detection signal when a detection result corresponds to a predetermined condition. For example, the cell monitor 1215 may generate the detection signal when a voltage used in the DRAM 1230 is unstable, an ECC error of the DRAM 1230 is over a predetermined level, a temperature of the DRAM 1230 is higher than a reference temperature, or current leakage of the DRAM 1230 is suddenly increased.

The cell monitor 1215 generates the detection signal at a predetermined time interval or when a utilization rate of the DRAM 1230 is over a predetermined level during a reference time. Also, the cell monitor 1215 generates the detection signal whenever a read or write count of the DRAM 1230 exceeds a predetermined level. The cell monitor 1215 includes, but not limited to, a voltage sensor, an ECC engine, a temperature sensor, and a current sensor to detect the above-described problems.

Figure 8:
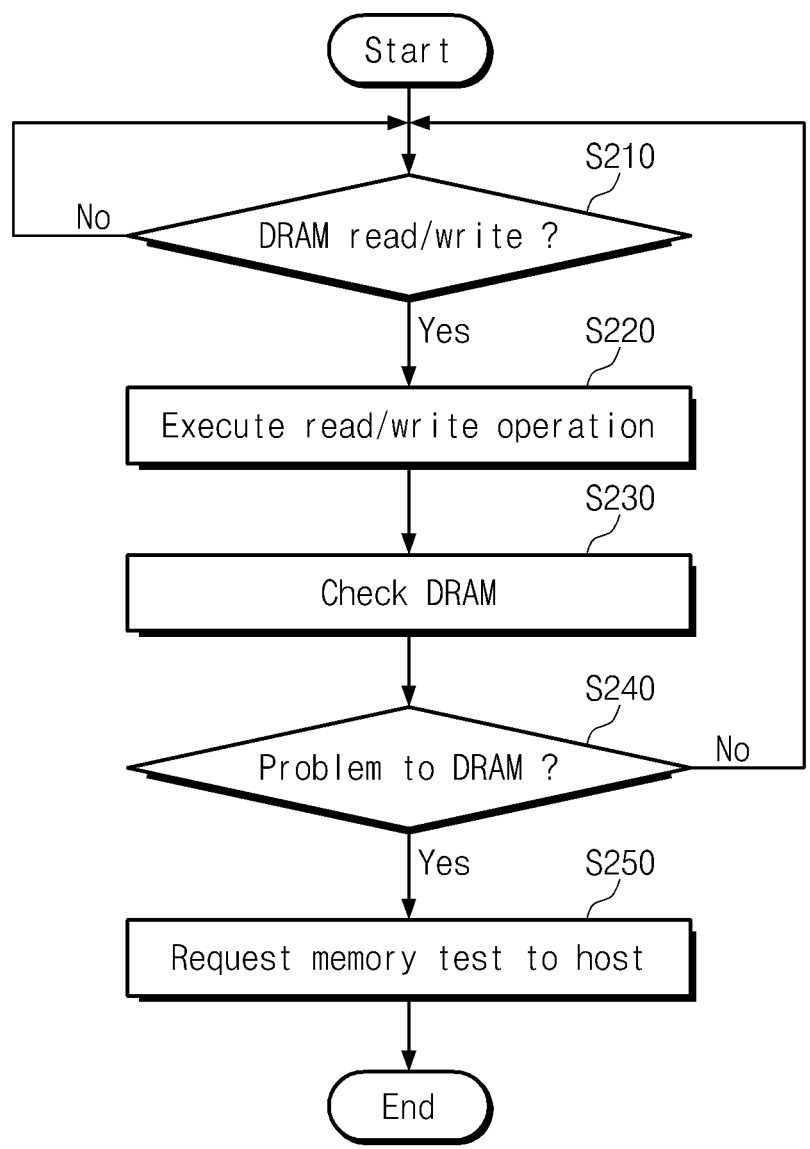
FIG. 8 is a flow chart for describing an operating method of a memory controller shown in FIG. 7, according to an exemplary embodiment.

FIG. 8 is a flow chart for describing an operating method of a memory controller shown in FIG. 7, according to an exemplary embodiment. Referring to FIG. 8, in step S210, a memory controller 1210 determines whether a read or write operation on a DRAM 1230 is requested. If not, to step S210 is repeated. If so, the method proceeds to step S220, in which a read or write operation is executed.

In step S230, a state of the DRAM 1230 is checked while the read or write operation is executed or after the read or write operation is executed. In step S240, the memory controller 1210 determines whether the DRAM 1230 is problematic. This is achieved by checking a current state of the DRAM 1230, using the voltage sensor, the ECC engine, the temperature sensor, and the current sensor of the cell monitor 1215. As a consequence of determining that the DRAM 1230 is not problematic, the method proceeds to step S210. As a consequence of determining that the DRAM 1230 is problematic, the method proceeds to step S250, in which the memory controller 1210 requests a memory test to a host 1100.

Afterwards, the host 1100 tests the DRAM 1230 in response to the memory test request. The host 1100 makes a bad cell list, depending on a test result. The bad cell list is stored at a flash memory 1220 or a previously stored bad cell list is updated.

Figure 9:
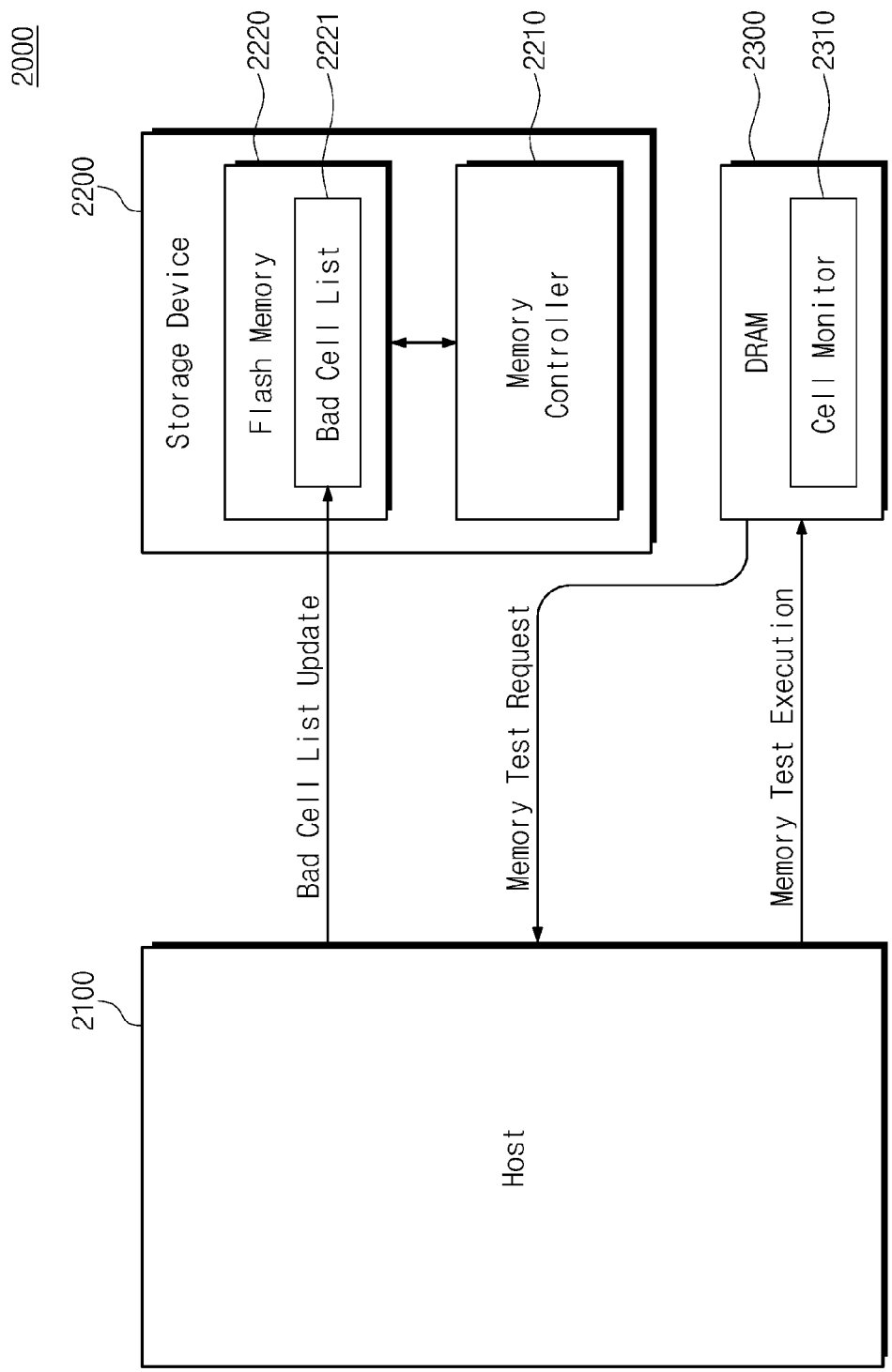
FIG. 9 is a block diagram schematically illustrating a storage system, according to another exemplary embodiment.

FIG. 9 is a block diagram schematically illustrating a storage system, according to another exemplary embodiment. Referring to FIG. 9, a storage system 2000 includes a host 2100, a storage device 2200, and a DRAM 2300. The storage device 2200 includes a memory controller 2210 and a flash memory 2220. The memory controller 2210 controls an operation of the flash memory 2220.

Referring to FIG. 9, the DRAM 2300 is placed outside the storage device 2200. The DRAM 2310 includes a cell monitor 2310. The cell monitor 2310 detects or predicts a problem with the DRAM 2300. The DRAM 2300 predicts a problem with the DRAM 2300 by means of the cell monitor 2310, and requests a memory test to the host 2100. The host 2100 tests the DRAM 2300 in response to the memory test request, and updates a bad cell list 2221 stored at the flash memory 2220.

Figure 10:
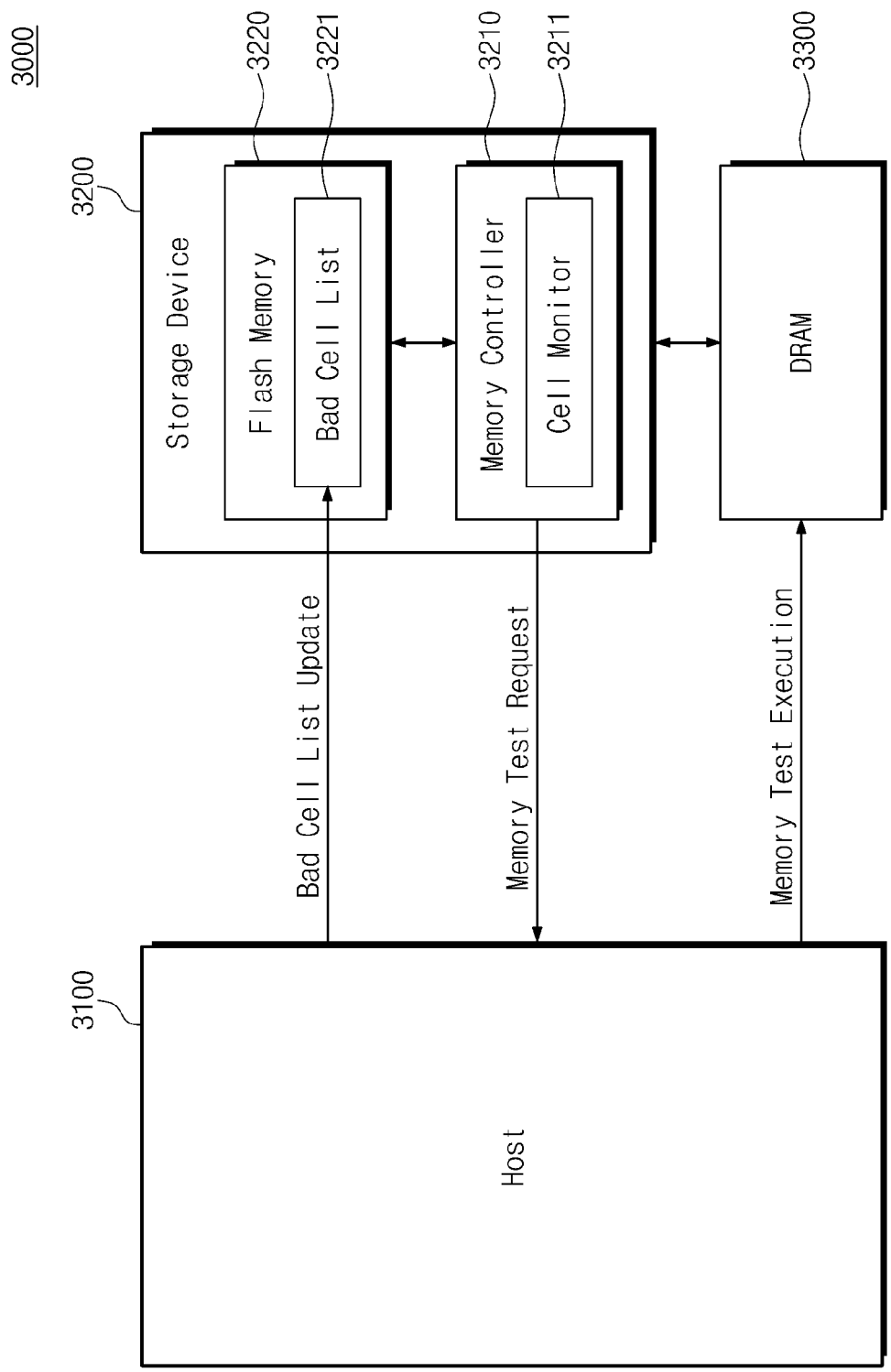
FIG. 10 is a block diagram schematically illustrating a storage system, according to still another exemplary embodiment.

FIG. 10 is a block diagram schematically illustrating a storage system, according to still another exemplary embodiment. Referring to FIG. 10, a DRAM 2300 is placed outside a storage device 3200, and the cell monitor 3211 is placed in the storage device 3200.

For example, the cell monitor 3211 may be included in a memory controller 3210. The cell monitor 2310 detects or predicts a problem with the DRAM 2300. The memory controller 3210 predicts a problem with the DRAM 3300 by means of the cell monitor 3311, and requests a memory test to a host 3100. The host 3100 tests the DRAM 3300 in response to the memory test request, and updates a bad cell list 3221 stored at a flash memory 3220.

Figure 11:
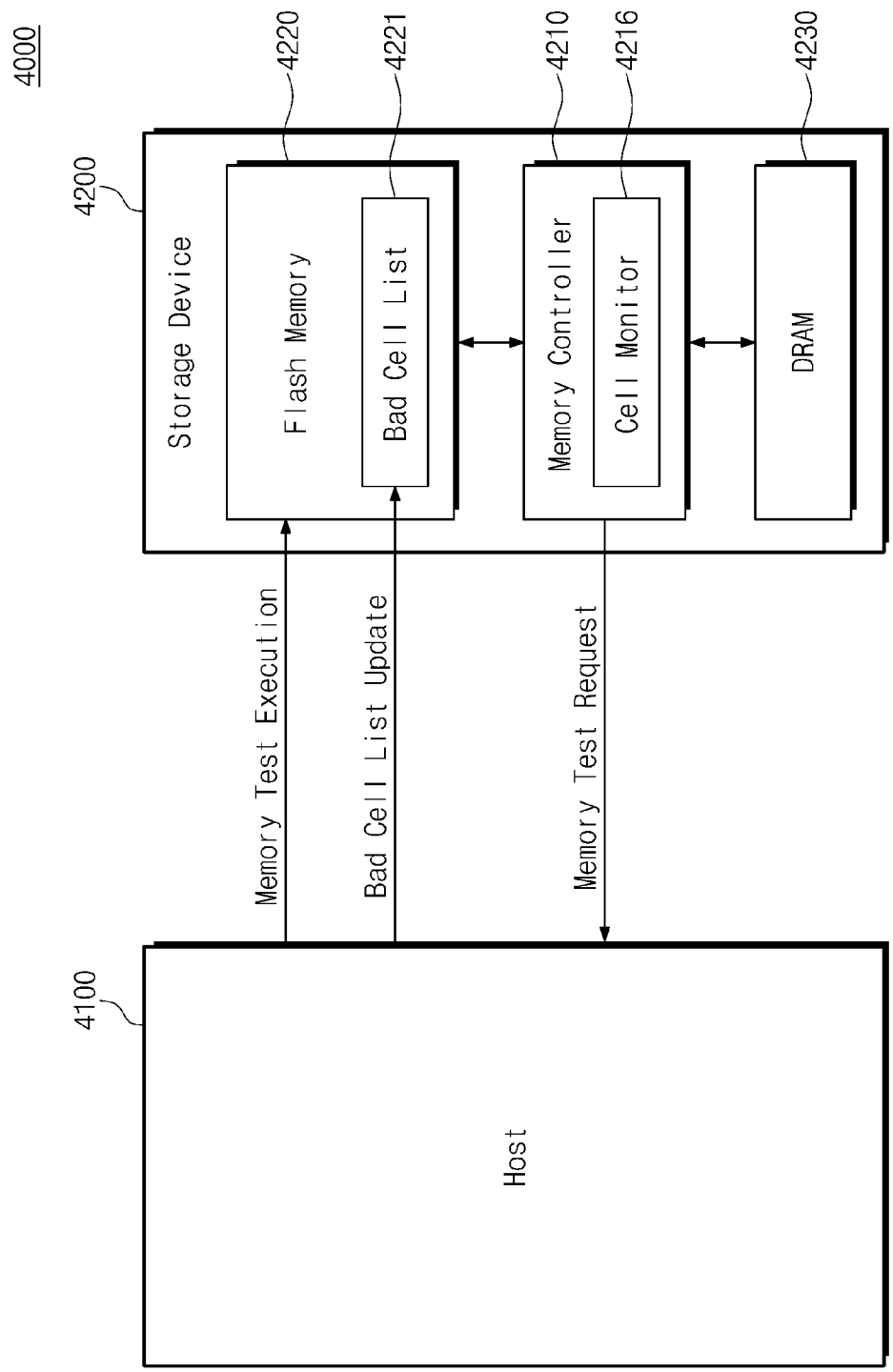
FIG. 11 is a block diagram schematically illustrating a storage system, according to a further embodiment.

FIG. 11 is a block diagram schematically illustrating a storage system, according to a further exemplary embodiment. Referring to FIG. 11, a storage system 4000 includes a host 4100 and a storage device 4200. The storage device 4200 includes a memory controller 4210, a flash memory 4220, and a DRAM 4230.

The memory controller 4210 includes a cell monitor 4216. The cell monitor 4216 detects or predicts a problem with the flash memory 4220. The memory controller 4210 predicts a problem with the flash memory 4220 by means of the cell monitor 4216, and requests a memory test to the host 4100. The host 4100 tests the flash memory 4220 in response to the memory test request, and updates a bad cell list 4221 stored at the flash memory 4220.

Figure 12:
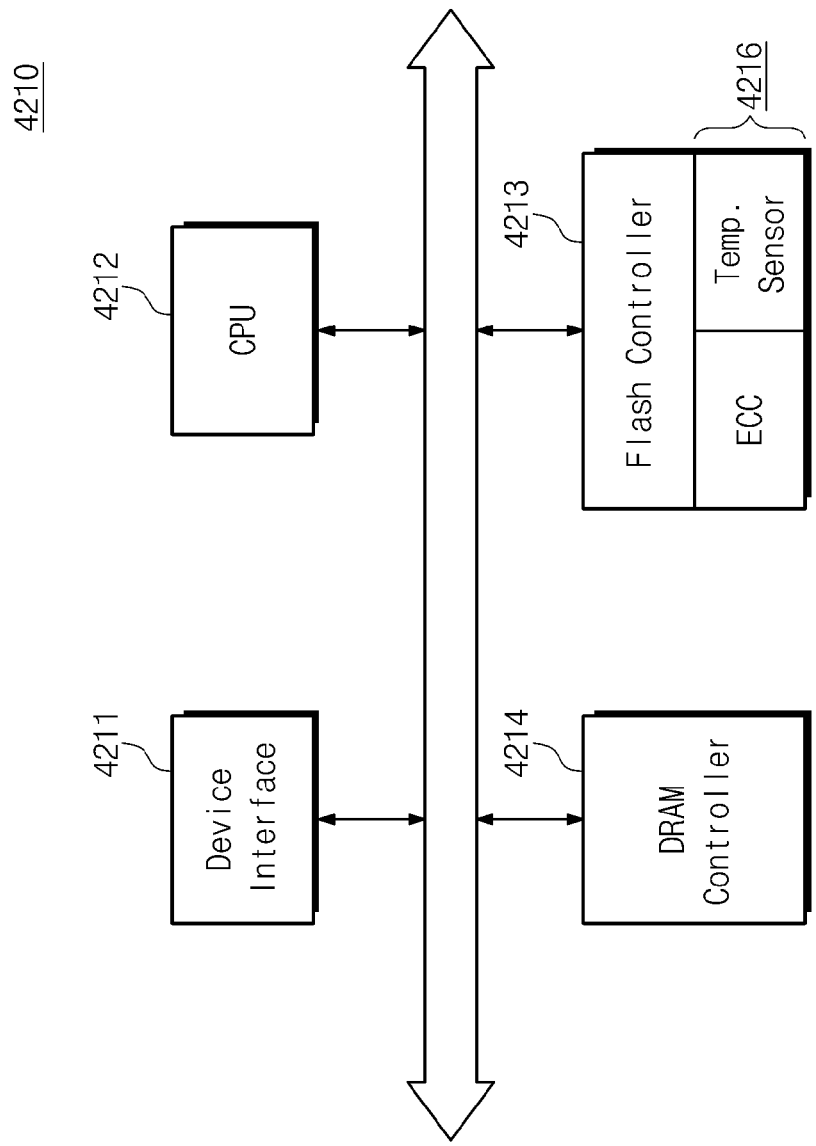
FIG. 12 is a block diagram schematically illustrating a memory controller shown in FIG. 11, according to an exemplary embodiment.

FIG. 12 is a block diagram schematically illustrating a memory controller shown in FIG. 11, according to an exemplary embodiment. Referring to FIG. 12, a memory controller 4210 includes a device interface 4211, a CPU 4212, a flash controller 4213, a DRAM controller 4214, and a cell monitor 4216. The cell monitor 4216 may be placed inside or outside the flash controller 4213.

The cell monitor 4216 detects a state of the flash memory 4220. The cell monitor 4216 generates a detection signal when the detection result corresponds to a predetermined condition. For example, the cell monitor 4216 generates the detection signal when an ECC error of the flash memory 4222 is over a predetermined level or a temperature is higher than a reference temperature. The cell monitor 4216 generates the detection signal when a reclaim is required due to charge leakage of flash memory cells at which a bad cell list 4221 is to be stored or stored.

The cell monitor 4216 generates the detection signal at a predetermined time interval or when a utilization rate of the flash memory 4220 is over a predetermined level during a reference time. Also, the cell monitor 4216 generates the detection signal whenever a read or write count of the flash memory 4220 exceeds a predetermined level. The cell monitor 4216 includes, but not limited to, an ECC engine and a temperature sensor to detect the above-described problems.

Figure 13:
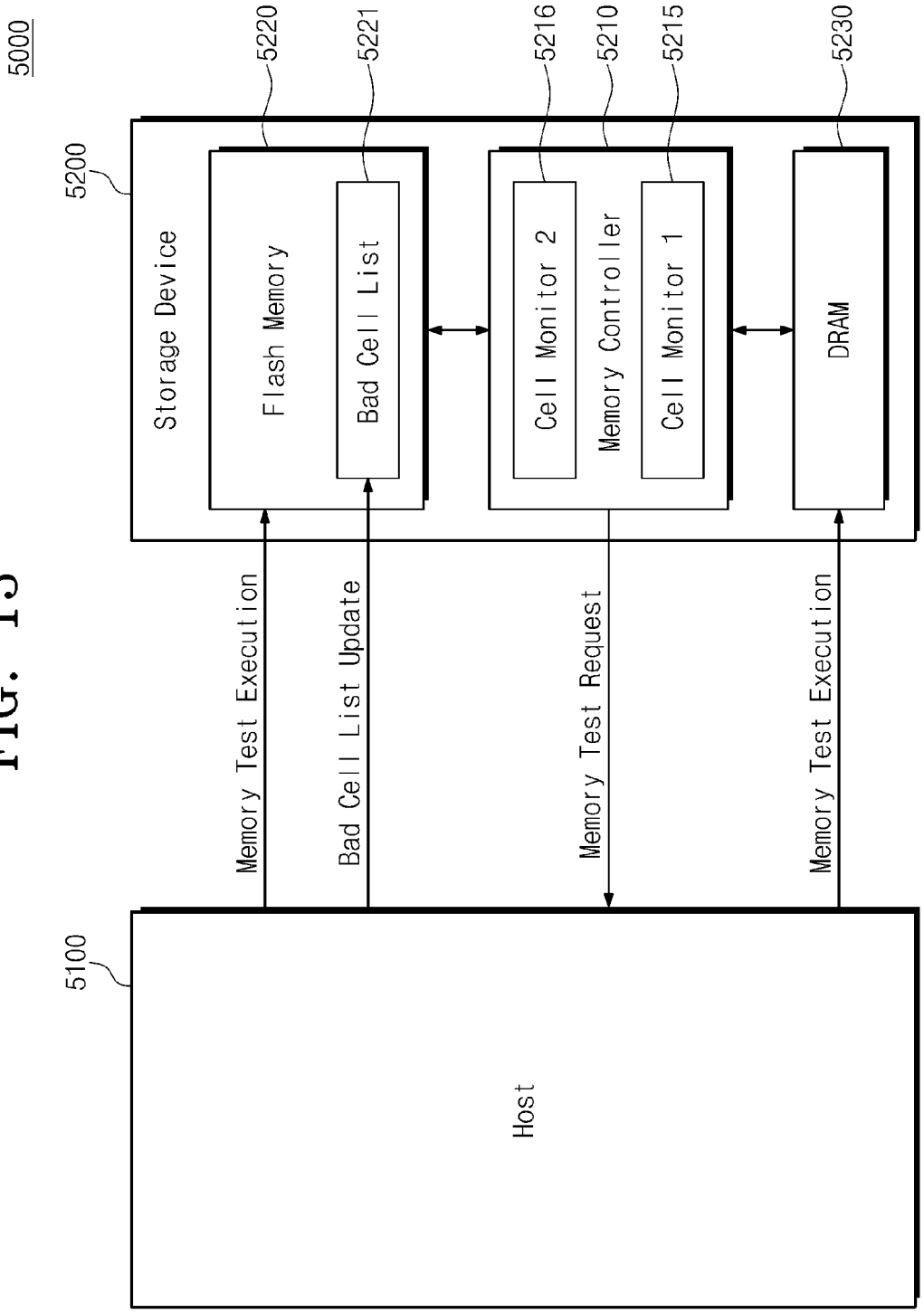
FIG. 13 is a block diagram schematically illustrating a storage system, according to a further exemplary embodiment.

FIG. 13 is a block diagram schematically illustrating a storage system, according to a further exemplary embodiment. Referring to FIG. 13, a memory controller 5210 contains first and second cell monitors 5215 and 5216. The first cell monitor 5215 detects or predicts a problem with a DRAM 5230, and the second cell monitor 5216 detects or predicts a problem with a flash memory 5220.

The memory controller 5210 predicts a problem with the DRAM 4230 and a problem with the flash memory 5220 by means of the first and second cell monitor 5214 and 5216, respectively, and requests a memory test to a host 5100. The host 5100 tests the DRAM 5230 and the flash memory 5220 in response to the memory test request, and stores a bad cell list 5221 at the flash memory 5220 or update a previously stored bad cell list.

Figure 14:
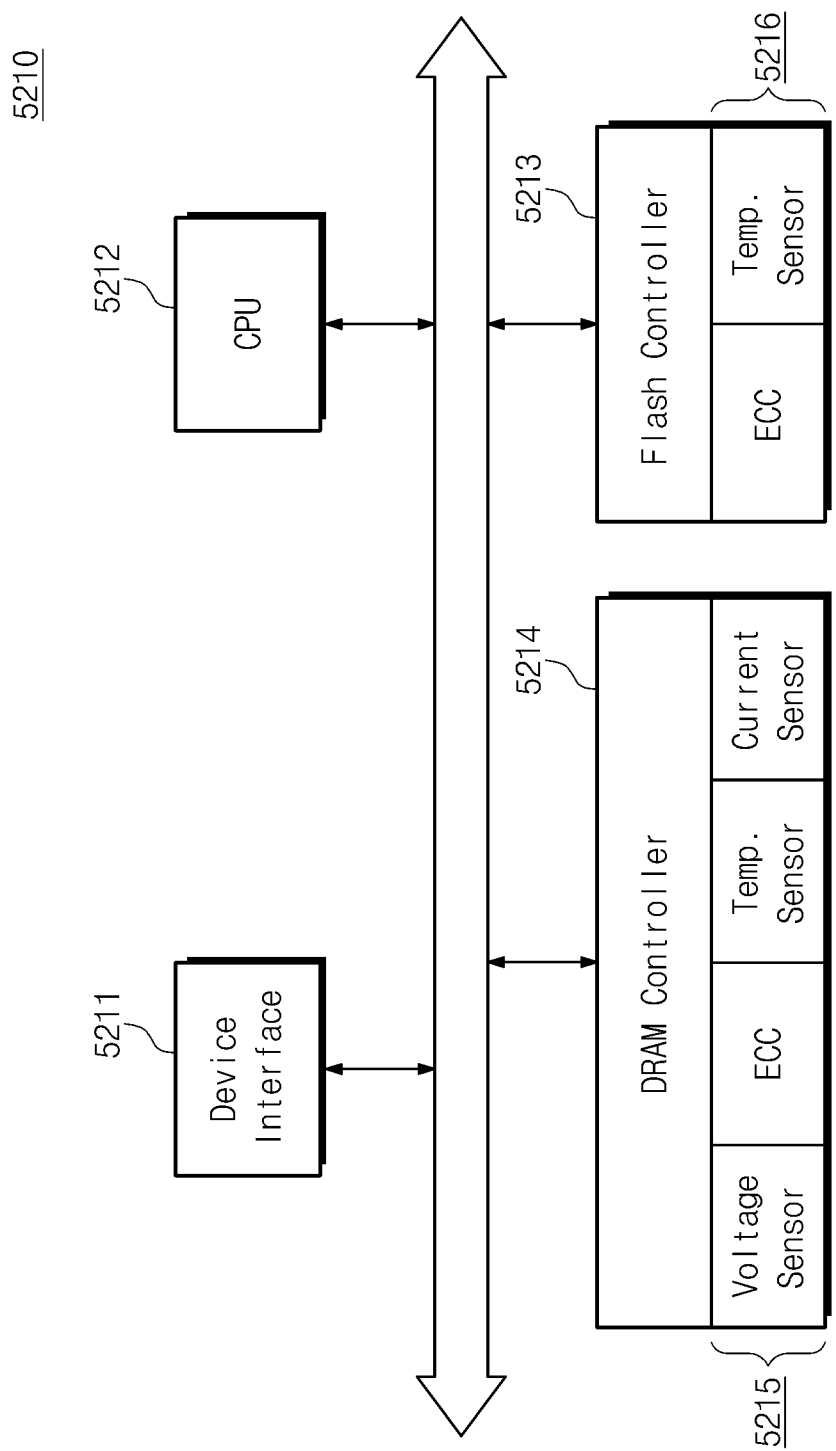
FIG. 14 is a block diagram schematically illustrating a memory controller shown in FIG. 13, according to an exemplary embodiment.

FIG. 14 is a block diagram schematically illustrating a memory controller shown in FIG. 13. Referring to FIG. 14, a memory controller 5210 includes a device interface 5211, a CPU 5212, a flash controller 5213, a DRAM controller 5214, and first and second cell monitors 5215 and 5216. The first and second cell monitors 5215 and 5216 operate the same as described with reference to FIG. 13.

Figure 15:
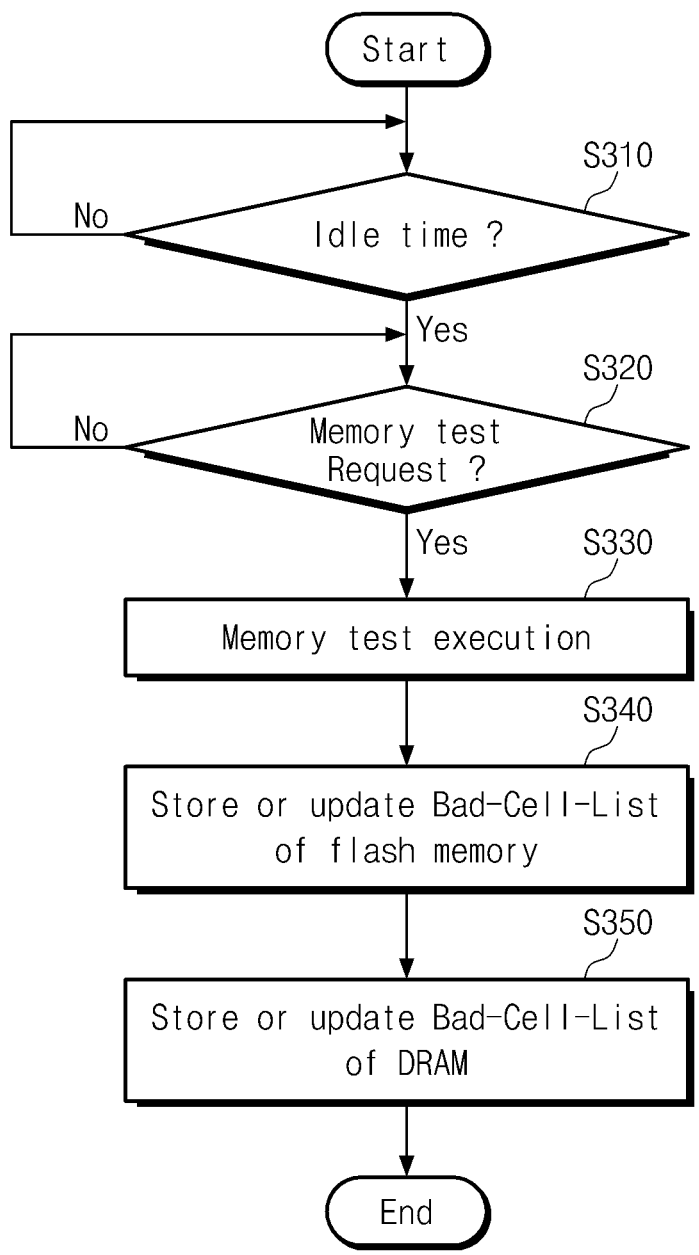
FIG. 15 is a flow chart showing a bad cell processing method of a host shown in FIG. 13, according to an exemplary embodiment.

FIG. 15 is a flow chart showing a bad cell processing method of a host shown in FIG. 13, according to an exemplary embodiment. Referring to FIG. 15, in step S310, the host 5100 determines whether a storage system 5000 is at an idle time. The host 5100 performs a bad cell processing operation at the idle time or when the storage system 5000 is at a time of low utilization. According to an exemplary embodiment, the storage device 5200 may request a memory test to the host 5100 only at an idle time of the flash memory 5220 and/or the DRAM 5230, or when the flash memory 5220 and/or the DRAM 5230 are at a time of low utilization.

Here, the time of low utilization may be a time when a number of read, write or erase operations currently being executed or to be executed within a predetermined time is less than a predetermined number, according to an exemplary embodiment. This number of the read, write or erase operations may be determined by the host 5100 or the memory controller 5210 of the storage device 5200, according to an exemplary embodiment.

In step S320, during the idle time, the host 5100 determines whether a memory test is requested from the storage device 5200. As a consequence of determining that the memory test is requested from the storage device 5200, in step S330, the host 5100 tests the memories 5220 and 5230 of the storage system 5200. In step S340, the host 5100 stores or updates a bad cell list of the memory 5220, depending on a test result of the storage system 5200. In step S350, the host 5100 stores or updates a bad cell list of the memory 5230, also depending on a test result of the storage system 5200.

Returning to step S320, when the memory test is requested from the storage system 5200, the host 5100 tests at least one of the memories 5220 and 5230 of the storage system 5200 without delay or depending on an internal schedule. Also, even though the memory test is requested, the host 5100 ignores when the memory test is internally determined as being not required.

Meanwhile, a storage system according to an exemplary embodiment may be applied to or used in various products. The storage system according to an exemplary embodiment may be implemented in electronic devices, such as, but not limited to, a personal computer, a digital camera, a camcorder, a handheld phone, an MP3 player, a portable media player (PMP), a PlayStation Portable (PSP), and a personal digital assistant (PDA). A storage medium of the storage system may be implemented with storage devices, such as, but not limited to, a memory card, a universal serial bus (USB) memory, and a solid state drive (SSD).

Figure 16:
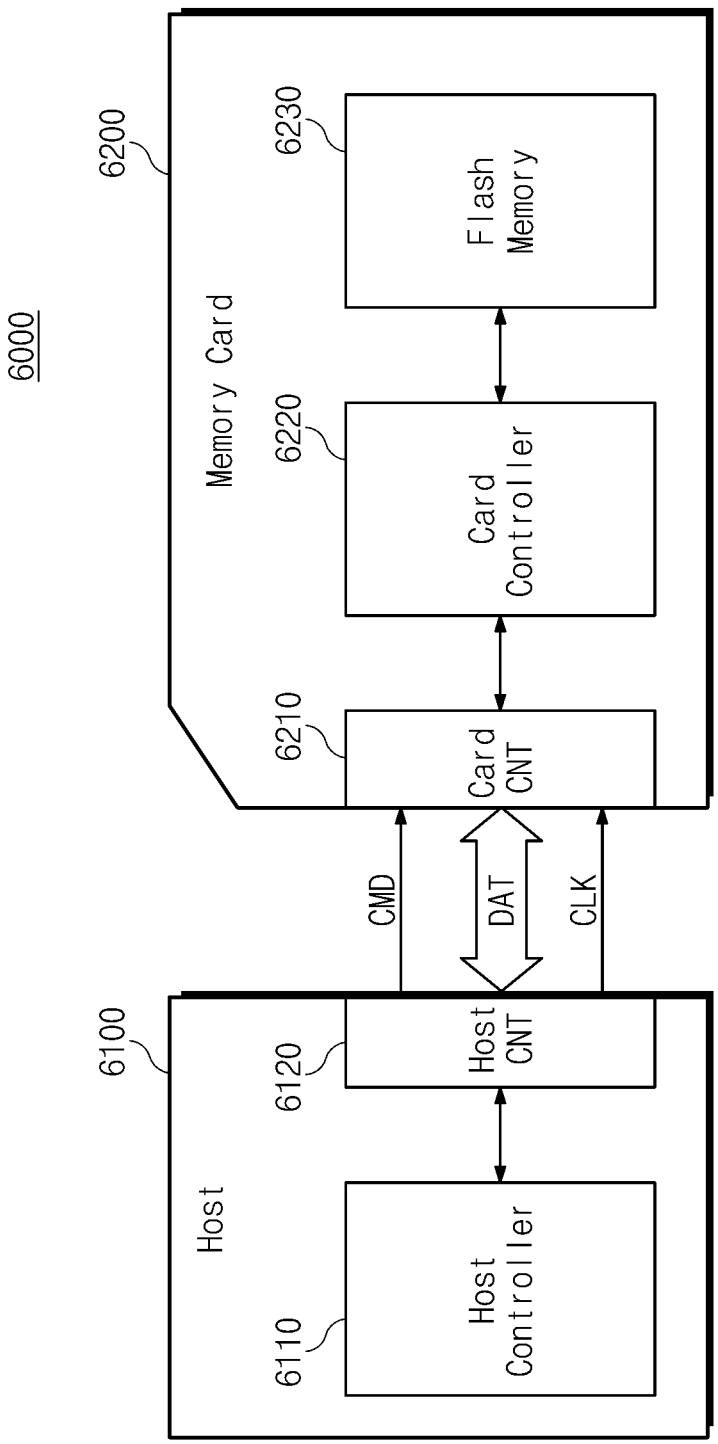
FIG. 16 is a block diagram schematically illustrating a memory card to which a storage device of a storage system described above is applied, according to an exemplary embodiment.

FIG. 16 is a block diagram schematically illustrating a memory card to which a storage device of a storage system described above is applied, according to an exemplary embodiment is applied. A memory card system 6000 includes a host 6100 and a memory card 6200. The host 6100 includes a host controller 6110 and a host connector 6120. The memory card 6200 includes a card connector 6210, a card controller 6220, and a flash memory 6230.

The host 6100 writes data at the memory card 6200 and reads data from the memory card 6200. The host controller 6110 provides the memory card 6200 with a command (e.g., a write command), a clock signal CLK generated from a clock generator (not shown) in the host 6100, and data through the host connector 6120.

The card controller 6220 stores data at the flash memory 6230 in response to a command input through the card connector 6210. The data is stored in synchronization with a clock signal generated from a clock generator (not shown) in the card controller 6220. The flash memory 6230 stores data transferred from the host 6100. For example, if the host 6100 is a digital camera, the memory card 6200 may store image data.

Figure 17:
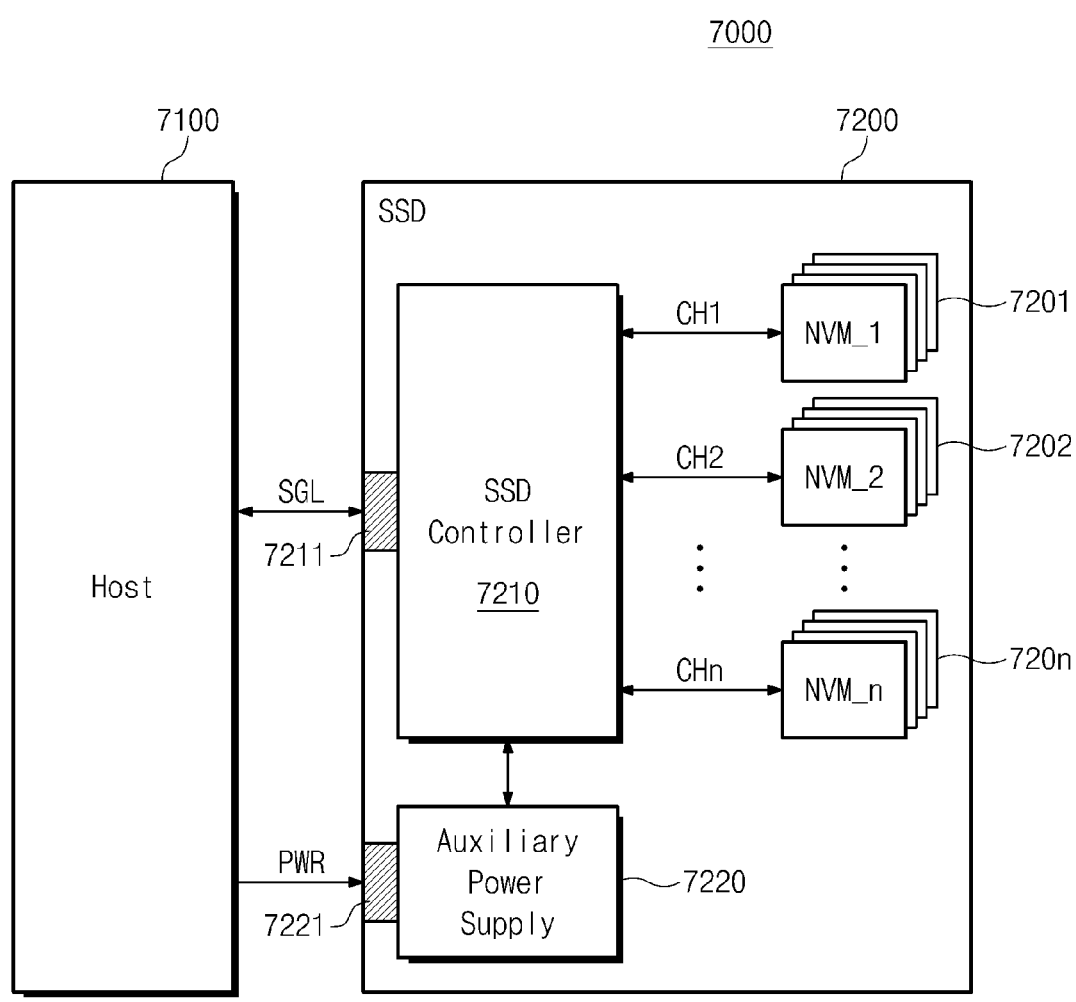
FIG. 17 is a block diagram illustrating a solid state drive to which a storage device described above is applied, according to an exemplary embodiment.

FIG. 17 is a block diagram illustrating a solid state drive to which a storage device described above is applied, according to an exemplary embodiment. Referring to FIG. 17, a solid state drive (SSD) system 7000 includes a host 7100 and an SSD 7200.

The SSD 7200 exchanges signals SGL with the host 7100 through a signal connector 7211 and is supplied with a power through a power connector 7221. The SSD 7200 includes a plurality of flash memories 7201 through 720n, an SSD controller 7210, and an auxiliary power supply 7220.

The plurality of flash memories 7201 through 720n may be used as a storage medium of the SSD 7200. Not only may the SSD 7200 employ the flash memory, but it may employ nonvolatile memory devices, such as PRAM, MRAM, ReRAM, and FRAM. The flash memories 7201 through 720n are connected with the SSD controller 7210 through a plurality of channels CH1 through CHn. One channel is connected with one or more flash memories. Flash memories connected with one channel may be connected with the same data bus.

The SSD controller 7210 exchanges signals SGL with the host 7100 through the signal connector 7211. The signals SGL may include the following: a command, an address, and data. The SSD controller 7210 is adapted to write or read out data to or from a corresponding flash memory in response to a command of the host 7100. The SSD controller 7210 will be more fully described with reference to FIG. 18.

The auxiliary power supply 7220 is connected with the host 7100 through the power connector 7221. The auxiliary power supply 7220 is charged by a power PWR from the host 7100. The auxiliary power supply 7220 may be placed inside or outside the SSD 7200. For example, the auxiliary power supply 7220 may be put on a main board to supply an auxiliary power to the SSD 7200.

Figure 18:
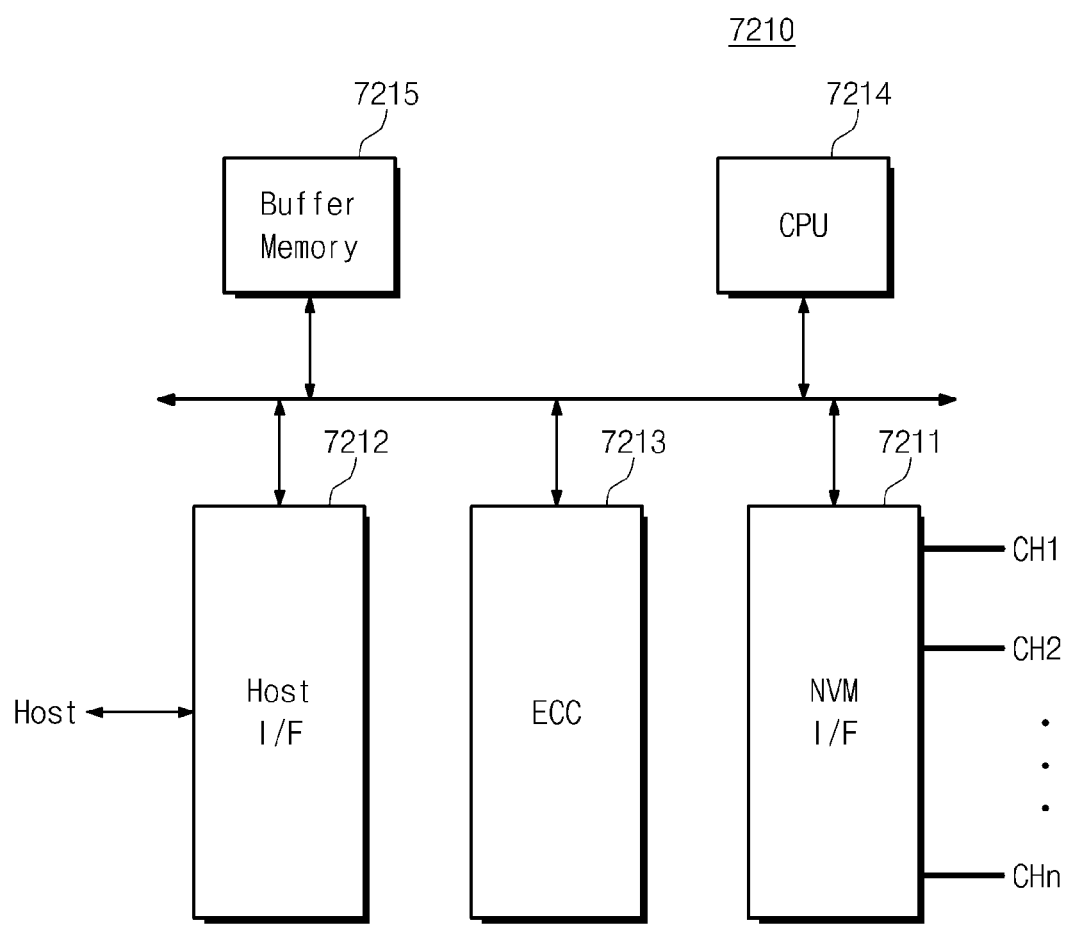
FIG. 18 is a block diagram schematically illustrating a solid state drive (SSD) controller shown in FIG. 17, according to an exemplary embodiment.

FIG. 18 is a block diagram schematically illustrating an SSD controller shown in FIG. 17, according to an exemplary embodiment. Referring to FIG. 18, an SSD controller 7210 includes an nonvolatile memory (NVM) interface 7211, a host interface 7212, an ECC circuit 7213, a CPU 7214, and a buffer memory 7215.

The NVM interface 7211 may scatter data transferred from the buffer memory 7215 into channels CH1 through CHn. The NVM interface 7211 transmits data read from flash memories 7201 through 720n to the buffer memory 7215. The NVM interface 7211 may use a flash memory interface manner, for example. That is, the SSD controller 7210 may perform a read, a write, and an erase operation in the flash memory interface manner.

The host interface 7212 may provide an interface with an SSD 7200 in compliance with the protocol of the host 7100. The host interface 7212 may communicate with the host 7100 by means of USB, SCSI (Small Computer System Interface), PCI express, ATA, PATA (Parallel ATA), SATA (Serial ATA), SAS (Serial Attached SCSI), and so on. The host interface 4712 may also perform disk emulation which enables the host 7100 to recognize the SSD 7200 as a hard disk drive (HDD).

The ECC circuit 7213 generates an error correction code ECC by means of data transferred to the flash memory 7201 through 720n. The error correction code ECC thus generated is stored at spare areas of the flash memory 7201 through 720n. The ECC circuit 7213 detects an error of data read from the flash memory 7201 through 720n. If the detected error is correctable, the ECC circuit 7213 may correct the detected error.

The CPU 7214 analyzes and processes signals received from a host 7100 (refer to FIG. 17). The CPU 7214 controls the host 7100 through the host interface 7212 or the flash memories 7201 through 720n through the NVM interface 7211. The CPU 7214 controls the flash memories 7201 through 720n by means of firmware for driving an SSD 7200.

The buffer memory 7215 temporarily stores write data provided from the host 7100 or data read from a flash memory. Also, the buffer memory 7215 stores metadata to be stored in the flash memories 7201 through 720n or cache data. At sudden power-off, the metadata or cache data stored at the buffer memory 7215 is stored in the flash memories 7201 through 720n. The buffer memory 7215 may be implemented with a DRAM, an SRAM, and so on.

Figure 19:
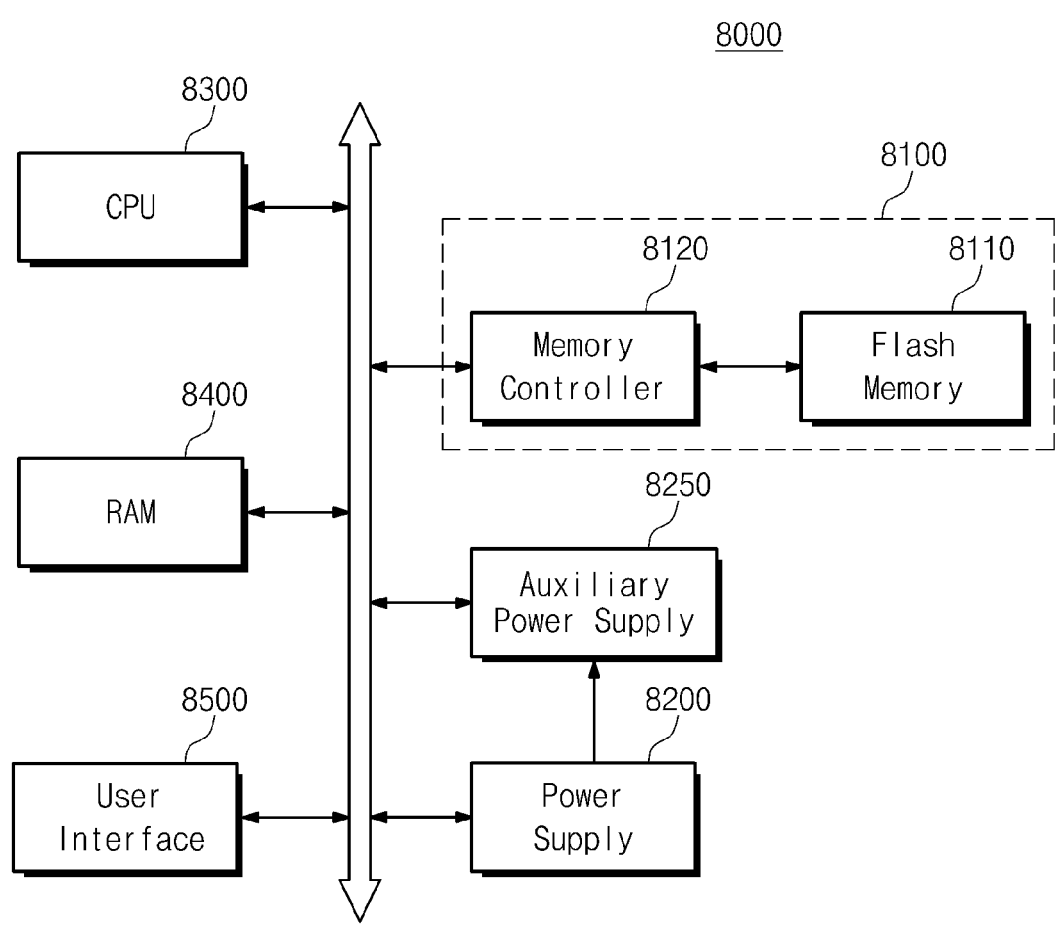
FIG. 19 is a block diagram schematically illustrating an electronic device including a storage device, according to an exemplary embodiment.

FIG. 19 is a block diagram schematically illustrating an electronic device including a storage device according to an exemplary embodiment. An electronic device 8000 may be implemented with a personal computer or with handheld electronic devices, such as a notebook computer, a cellular phone, a PDA, and a camera.

Referring to FIG. 19, the electronic device 8000 includes a memory system 8100, a power supply 8200, an auxiliary power supply 8250, a CPU 8300, a RAM 8400, and a user interface 8500. The memory system 8100 contains a flash memory 8110 and a memory controller 8120.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A storage system comprising:
   a storage device comprising a first memory, a second memory, a memory controller, and a cell monitor,
   wherein the cell monitor is configured to:
      detect a state of at least one among the first memory and the second memory; and
      determine that the detected state corresponds to a predetermined condition, and
   wherein the memory controller is configured to transmit a request for a memory test, in response to the cell monitor determining that the detected state corresponds to the predetermined condition; and
   a host comprising a host memory and a host controller, the host being disposed on a circuit that is separate from a circuit on which the storage device is disposed,
   wherein the host controller is configured to:
      receive the request for the memory test, from the storage device;
      perform the memory test on the at least one among the first memory and the second memory in response to the host controller receiving the request for the memory test, from the memory controller; and
      store a result of the performed memory test, in the first memory or a third memory.

2. The storage system of claim 1, wherein the storage device is further configured to transmit the request for the memory test to the host at a time interval.

3. The storage system of claim 1, wherein the predetermined condition is at least one among:
   an error in an error correction code of the at least among the first memory and the second memory being over an amount of a reference error;
   a leakage current of the at least one among the first memory and the second memory increasing over an amount of a reference current;
   a temperature of the at least one among the first memory and the second memory being higher than a reference temperature;
   utilization of the at least one among the first memory and the second memory being over a level during a reference time period; and a number of read, write, or erase operations that are performed by the at least one among the first memory and the second memory exceeding a level.

4. The storage system of claim 1, wherein the host is further configured to perform the memory test in response to the receiving the request for the memory test from the storage device, to find run-time bad cells.

5. The storage system of claim 4, wherein the host is further configured to generate a bad cell list comprising the run-time bad cells, store the bad cell list in the first memory or the third memory, and update the stored bad cell list.

6. The storage system of claim 1, wherein the first memory is one among a flash memory, an electrically erasable programmable read-only memory, a magnetoresistive random-access memory (MRAM), a phase-change memory (PRAM), and a ferroelectric random-access memory (FeRAM), and
wherein the second memory is one among a dynamic random-access memory, a PRAM, a static random-access memory, an MRAM, and an FeRAM.

7. A storage device comprising:
a first memory and a second memory, at least one among which is subject to a memory test by an external device disposed on a circuit that is separate from a circuit on which the storage device is disposed;
a cell monitor configured to determine that a predetermined condition of the at least one among the first memory and the second memory is satisfied; and
a memory controller configured to transmit, to the external device, a request for the memory test to be performed by the external device, in response to the cell monitor determining that the predetermined condition of the at least one among the first memory and the second memory is satisfied,
wherein a result of the memory test performed by the external device is stored in the first memory or a third memory connected to the storage device.

8. The storage device of claim 7, wherein a list of bad cells of the at least one among the first memory and the second memory is stored in the first memory or the third memory, or the stored list of the bad cells is updated.

9. The storage device of claim 8, wherein the bad cells are run-time bad cells occurring when a product comprising the storage device is in use.

10. The storage device of claim 7, wherein the memory controller is further configured to transmit the request for the memory test to the external device at a time interval.

11. The storage device of claim 7, wherein the predetermined condition is at least one among:
an error in an error correction code of the at least one among the first memory and the second memory being over an amount of a reference error;
a leakage current of the at least one among the first memory and the second memory increasing over an amount of a reference current;
a temperature of the at least one among the first memory and the second memory being higher than a reference temperature;
utilization of the at least one among the first memory and the second memory being over a level during a reference time period; and
a number of read, write, or erase that are operations performed by the at least one among the first memory and the second memory exceeding a level.

12. The storage device of claim 7, wherein the first memory or the third memory is one among a flash memory, an electrically erasable programmable read-only memory, a magnetoresistive random-access memory (MRAM), a phase-change memory (PRAM), and a ferroelectric random-access memory (FeRAM), and
wherein the second memory is one among a dynamic random-access memory, a static random-access memory, an MRAM, a PRAM, and an FeRAM.

13. The storage device of claim 7, wherein the memory controller is further configured to transmit the request for the memory test to the external device in response to determining at least one among:
that a power state of the storage device is changed from an off-state to an on-state; and
that a number of read, write, or erase operations currently being executed or to be executed in the at least one among the first memory and the second memory within a time period is less than a number.

14. The storage device of claim 13, wherein the predetermined condition is at least one among:
an error in an error correction code of the at least one among the first memory and the second memory being over an amount of a reference error;
a leakage current of the at least one among the first memory and the second memory increasing over an amount of a reference current;
a temperature of the at least one among the first memory and the second memory being higher than a reference temperature;
utilization of the at least one among the first memory and the second memory being over a level during a reference time period; and
a number of read, write, or erase that are operations performed by the at least one among the first memory and the second memory exceeding a level.

15. A method of performing a memory test at a storage device, the method comprising:
determining, by a cell monitor included in the storage device, that a predetermined condition of the at least one among a first memory and a second memory that are included in the storage device is satisfied;
generating, by a memory controller included in the storage device, a request for the memory test to be performed by an external device with respect to at least one among the first memory and the second memory, in response to the determining that the predetermined condition of the at least one among the first memory and the second memory is satisfied, the external device being disposed on a circuit that is separate from a circuit on which the storage device is disposed;
transmitting, by the memory controller, the generated request for the memory test, to the external device; and
receiving and storing a result of the memory test performed by the external device, in the first memory or a third memory.

16. The method of claim 15, wherein the generating comprises generating the request for the memory test at a time interval.

17. The method of claim 15, wherein the predetermined condition is at least one among:
an error in an error correction code of the at least one among the first memory and the second memory being over an amount of a reference error;
a leakage current of the at least one among the first memory and the second memory increasing over an amount of a reference current;
a temperature of the at least one among the first memory and the second memory being higher than a reference temperature;

utilization of the at least one among the first memory and the second memory being over a level during a reference time period; and a number of read, write, or erase that are operations performed by the at least one among the first memory and the second memory exceeding a level.

18. The method of claim 15, wherein the storing comprises storing a list of bad cells of the at least one among the first memory and the second memory in the first memory or the third memory, or updating the stored list of the bad cells.

19. The method of claim 15, wherein the generating comprises generating the request for the memory test in response to determining:

that a power state of the storage device is changed from an off-state to an on-state; and that a number of read, write, or erase operations currently being executed or to be executed in the at least one among the first memory and the second memory within a time period is less than a number.

20. The method of claim 19, wherein the predetermined condition comprises:

an error in an error correction code of the at least one among the first memory and the second memory being over an amount of a reference error;

a leakage current of the at least one among the first memory and the second memory increasing over an amount of a reference current;

a temperature of the at least one among the first memory and the second memory being higher than a reference temperature;

utilization of the at least one among the first memory and the second memory being over a level during a reference time period; and a number of read, write, or erase that are operations performed by the at least one among the first memory and the second memory exceeding a level.

* * * * *